United States Patent
Martin et al.

(10) Patent No.: US 6,600,333 B1
(45) Date of Patent: Jul. 29, 2003

(54) METHOD AND TEST STRUCTURE FOR CHARACTERIZING SIDEWALL DAMAGE IN A SEMICONDUCTOR DEVICE

(75) Inventors: Jeremy I. Martin, Austin, TX (US); Nicholas J. Kepler, Saratoga, CA (US); Larry L. Zhao, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/501,958

(22) Filed: Feb. 10, 2000

(65) Prior Publication Data (65)

(51) Int. Cl.$^7$ .......................... G01R 27/26; G01R 31/26
(52) U.S. Cl. ....................................... 324/765; 324/679
(58) Field of Search ................................ 324/765, 766, 324/537, 551, 519, 679, 158.1, 751; 438/15, 18

(56) References Cited

U.S. PATENT DOCUMENTS

| | | | |
|---|---|---|---|
| 4,855,253 A | * 8/1989 | Weber | 437/8 |
| 5,264,377 A | * 11/1993 | Chesire et al. | 437/8 |
| 5,838,161 A | * 11/1998 | Akram et al. | 324/755 |
| 6,057,171 A | * 5/2000 | Chou et al. | 438/15 |

OTHER PUBLICATIONS

"Device Dependence of Charging Effects from High–Current Ion Implantation" by Felch et al. IEEE Transactions on Electron Devices, vol. 35, No. 12, Dec. 1988.*

* cited by examiner

*Primary Examiner*—Ernest Karlsen
*Assistant Examiner*—Paresh Patel
(74) *Attorney, Agent, or Firm*—Williams, Morgan & Amerson, P.C.

(57) ABSTRACT

A test circuit includes a wafer, an insulative layer formed on the wafer, and a plurality of test structures formed in the insulative layer. Each of the test structures comprises a first comb having a first plurality of fingers and a second comb having a second plurality of fingers. The first and second pluralities of fingers are interleaved to define a finger spacing between the first and second pluralities of fingers. The finger spacing in a first one of the test structures being different than the finger spacing in a second one of the test structures. A method for characterizing damage in a semiconductor device includes providing a wafer having an insulative layer and a plurality of test structures formed in the insulative layer. The test structures have different geometries. An electrical characteristic of first and second test structures of the plurality of test structures is determined. The electrical characteristics of the first and second test structures is compared. Damage to the insulative layer is characterized based on the comparison.

10 Claims, 4 Drawing Sheets

METHOD AND TEST STRUCTURE FOR CHARACTERIZING SIDEWALL DAMAGE IN A SEMICONDUCTOR DEVICE

BACKGROUND OF THE INVENTION

1. Field of the Invention

This invention relates generally to the field of semiconductor manufacturing, and, more particularly, to a method and test structure for characterizing sidewall damage in a semiconductor device.

2. Description of the Related Art

A conventional integrated circuit device, such as a microprocessor, is typically comprised of many thousands of semiconductor devices, e.g., transistors, formed above the surface of a semiconductive substrate. For the integrated circuit device to function, the transistors must be electrically connected to one another through conductive interconnect structures. Many modern integrated circuit devices are very densely packed, i.e., there is very little space between the transistors formed above the substrate. Thus, these conductive interconnect structures must be made in multiple layers to conserve plot space on the semiconductive substrate.

The conductive interconnect structures are typically accomplished through the formation of a plurality of conductive lines and conductive plugs formed in alternative layers of dielectric materials formed on the device. As is readily apparent to those skilled in the art, the conductive plugs are means by which various layers of conductive lines, and/or semiconductor devices, may be electrically coupled to one another. The conductive lines that connect the various interconnect structures are commonly formed in trenches defined in the dielectric layers.

The term "contact" is generally used to define an interconnect structure (e.g., using polysilicon or metal) to an underlying polysilicon layer (e.g., source/drain or gate region of a transistor), while a "via" denotes a metal to metal interconnect structure. In either case, a contact opening is formed in an insulating layer overlaying the conductive member. A second conductive layer is then formed in the contact opening and electrical communication is established with the conductive member.

One technique for reducing the size of the features formed on the semiconductor device involves the use of copper for the lines and interconnections in conjunction with new dielectric materials having lower dielectric constants than previously achievable with common dielectric material choices. Standard dielectric materials such as silicon dioxide deposited by plasma enhanced chemical vapor deposition (PECVD) using silane or TEOS precursors have dielectric constants greater than 4. The new dielectric materials, commonly referred to as low-k dielectrics, have dielectric constants of 3 or less, and thus, allow greater device densities due to their more efficient isolation capabilities. One such low-k dielectric is sold under the name of Black Diamond, by Applied Materials, Inc.

One problem associated with various low-k dielectrics is the relative difficulty in etching features, such as contact openings or trenches, therein. As a result, the etching process can sometimes damage the sidewalls of the feature defined in the dielectric material. Sidewall damage decreases the effective dielectric constant of the feature and increases leakage current in the device. If the sidewalls are sufficiently damaged, the performance of the device containing the damaged features may be significantly degraded or even entirely compromised, resulting in the scrapping of the device.

During the fabrication of semiconductor devices on a wafer, test structures are commonly formed on the wafer coincident with the discrete semiconductor dice. The test structure includes trenches filled with copper similar in construct to the actual trenches and lines that comprise the functional semiconductor devices. Because the processes used to form functional devices is also used to form the test structures, characteristics of the semiconductor devices may be inferred by evaluating the results of testing on the test structures. Defects that exist in the test structure are likely to be similar in type and distribution to those present in the semiconductor devices. For example, capacitance and leakage tests performed on the test structures give insight as to the capacitance and leakage properties of the semiconductor devices. Test structures may be formed on the same wafer with actual devices, or alternatively, they may be formed on dedicated test wafers on which no saleable devices are present.

One useful parameter that is derivable from such measurements, is the dielectric constant ("k") of the insulator in which the trenches are formed. Using the known geometry of the test structure, the known dielectric constant of the other dielectric layers, the measured dimensions of each part of the structure (e.g., cross-sectional scanning electron microscope measurements of film thickness, line width, line height, etc.), and the capacitance measurements, the dielectric constant of the low-k material may be determined, typically using commercially available software applications.

Referring to FIG. 1, a top view of a prior art test structure 10 is provided. The test structure 10 is referred to in the art as a comb serpentine test structure due to its geometry. Only a portion of the test structure 10 is shown. The test structure 10 includes two combs 20, each having a base portion 30, fingers 40, and a contact pad 45. The fingers 40 of the combs 20 are interleaved. A serpentine line 50, having a contact pad 60 weaves through the space between the interleaved combs 20. Another contact pad (not shown) is present on the end of the serpentine line 50 that is not visible. The contact pads 45, 60 are suitable areas to which an electrical probe may be attached for testing the electrical characteristics of the test structure 10. Other prior art test structures only employ the combs 20 and omit the serpentine line 50.

Using the test structure 10, the capacitance, and therefrom, the dielectric constant may be determined. Capacitance is measurable using the combs 20 and resistance is measurable using the serpentine line 50. Deviations between the measured dielectric constant the dielectric constant measured of the insulative layer are generally caused by damage to the insulative layer inflicted during its fabrication. The cause of the damage may vary. For example, an etch tool employed to form the trenches might cause damage localized on the sidewalls of the trenches. Alternatively, a photoresist strip tool, commonly referred to as an asher, might evenly damage the surface of the entire insulative layer.

Relatively severe damage localized on the sidewalls may have the same effect on the bulk dielectric constant than a relatively small amount of damage evenly inflicted across the insulative layer. Because the testing described above measures only the bulk dielectric constant, it is unable to distinguish between these two types of damage. Hence, the root cause of the problem is not easily diagnosed.

The present invention is directed to overcoming, or at least reducing the effects of, one or more of the problems set forth above.

SUMMARY OF THE INVENTION

One aspect of the present invention is seen in a test circuit including a wafer, an insulative layer formed on the wafer, and a plurality of test structures formed in the insulative layer. Each of the test structures comprises a first comb having a first plurality of fingers and a second comb having a second plurality of fingers. The first and second pluralities of fingers are interleaved to define a finger spacing between the first and second pluralities of fingers. The finger spacing in a first one of the test structures being different than the finger spacing in a second one of the test structures.

Another aspect of the present invention is seen in a method for characterizing damage in a semiconductor device. The method includes providing a wafer having an insulative layer and a plurality of test structures formed in the insulative layer. The test structures have different geometries. An electrical characteristic of first and second test structures of the plurality of test structures is determined. The electrical characteristics of the first and second test structures is compared. Damage to the insulative layer is characterized based on the comparison.

BRIEF DESCRIPTION OF THE DRAWINGS

The invention may be understood by reference to the following description taken in conjunction with the accompanying drawings, in which like reference numerals identify like elements, and in which.

Figure 1:
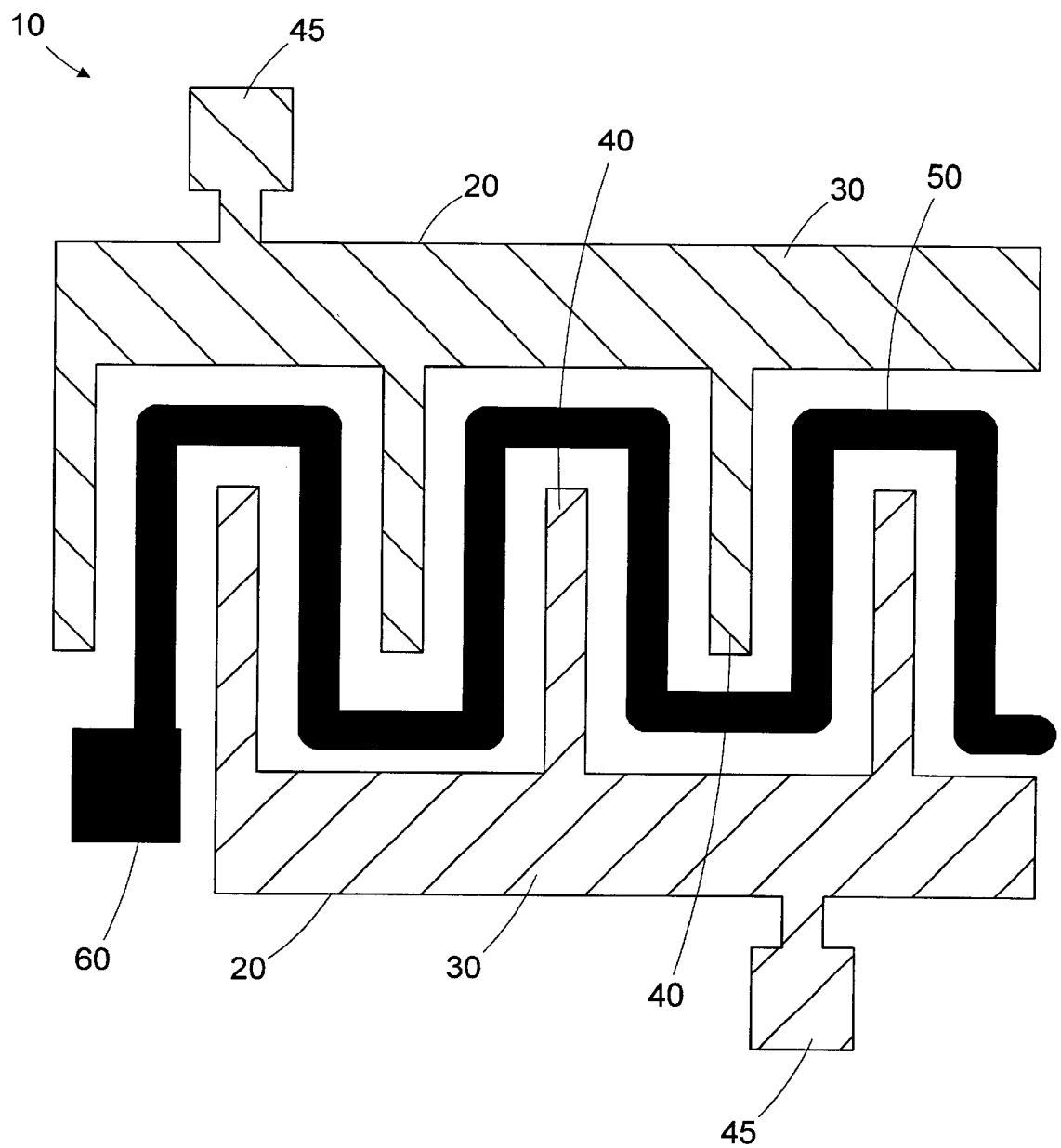
FIG. 1 is a top view of a prior art test structure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
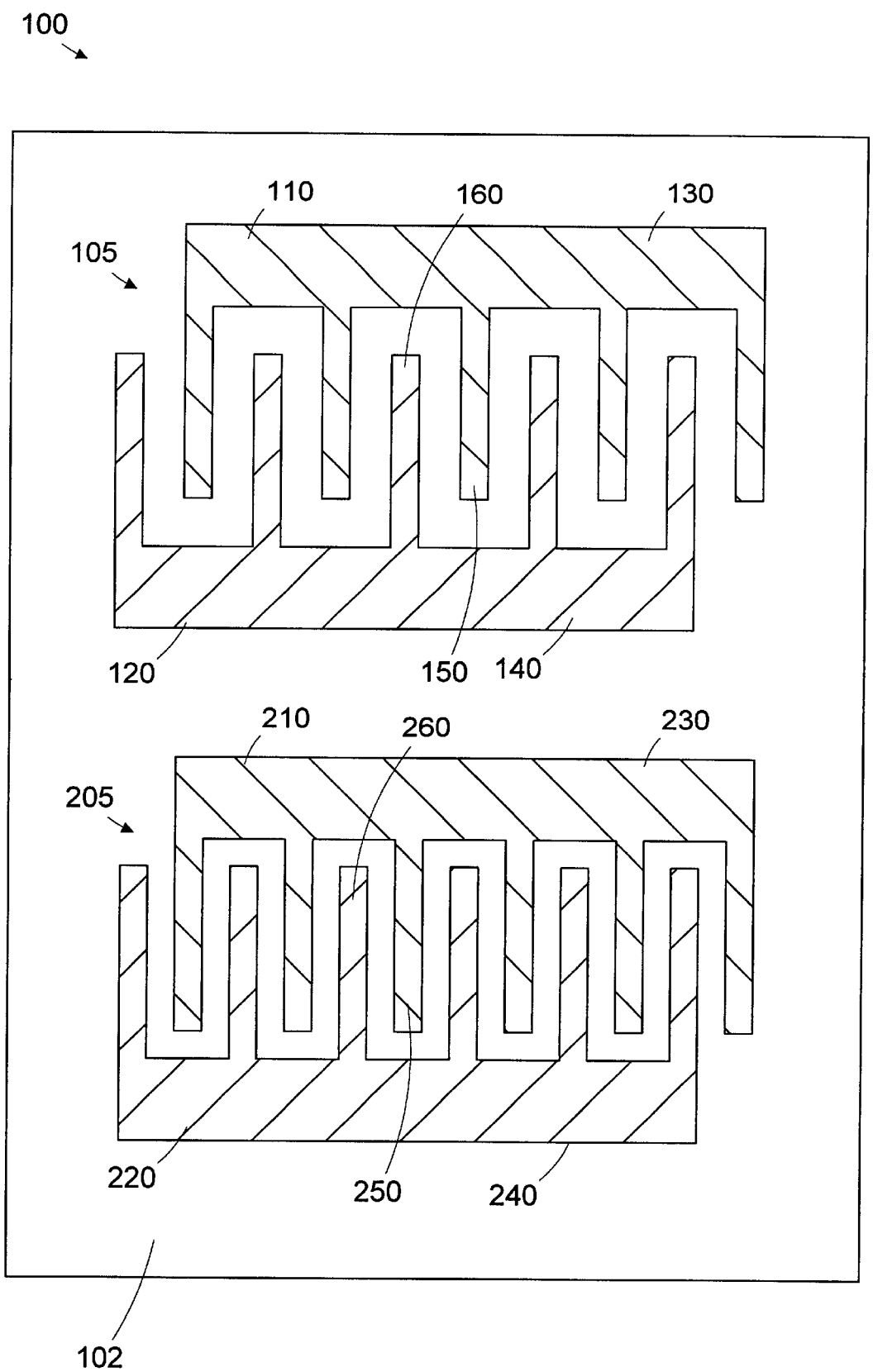
FIG. 2 is a top view of a test circuit in accordance with the present invention.

Referring to FIG. 2, a top view of a test circuit 100 in accordance with the present invention is provided. The test circuit 100 is formed in an insulative layer 102 formed on a wafer (not shown) and includes first and second test structures 105, 205, respectively. Although the invention is described using a two part test circuit 100, the test circuit 100 may have three or more portions in an actual implementation. In the illustrated embodiment, the first and second test structures 105, 205 comprise copper features formed in trenches defined in the insulative layer 102.

The first test structure 105 includes combs 110, 120, each having a base 130, 140 and fingers 150, 160, respectively. The fingers 150, 160 are interleaved. As is well known in the art, a serpentine line may be employed between the combs 110, 120, but for clarity and ease of illustration, it is omitted. Also, contact pads (not shown) on the combs 110, 120 are omitted for ease of illustration. The second test structure 205 includes combs 210, 220, each having a base 230, 240 and interleaved fingers 250, 260, respectively. The difference between the first and second test structures 105, 205 is their geometries. The fingers 150, 160 of the first test structure 105 are more widely spaced than the fingers 250, 260 of the second test structure 205. This geometry difference results in there being more dielectric material of the insulative layer 102 between the fingers 150, 160 than is present between the fingers 250, 260.

The particular line widths and finger spacing chosen depends on the characteristics of the actual devices formed on the wafer. To be able to correlate the performance of the test circuit 100 to that of the devices, they must have similar geometries. As an illustrative example, the width of the fingers 150, 160, 250, 260 in the test circuit 100 is between about 0.2 microns and 0.5 microns. The spacing between the adjacent fingers 150, 160, 250, 260 (i.e., finger spacing) may range from about 0.18 microns up to about 1 microns (e.g., 105).

Figure 3A:
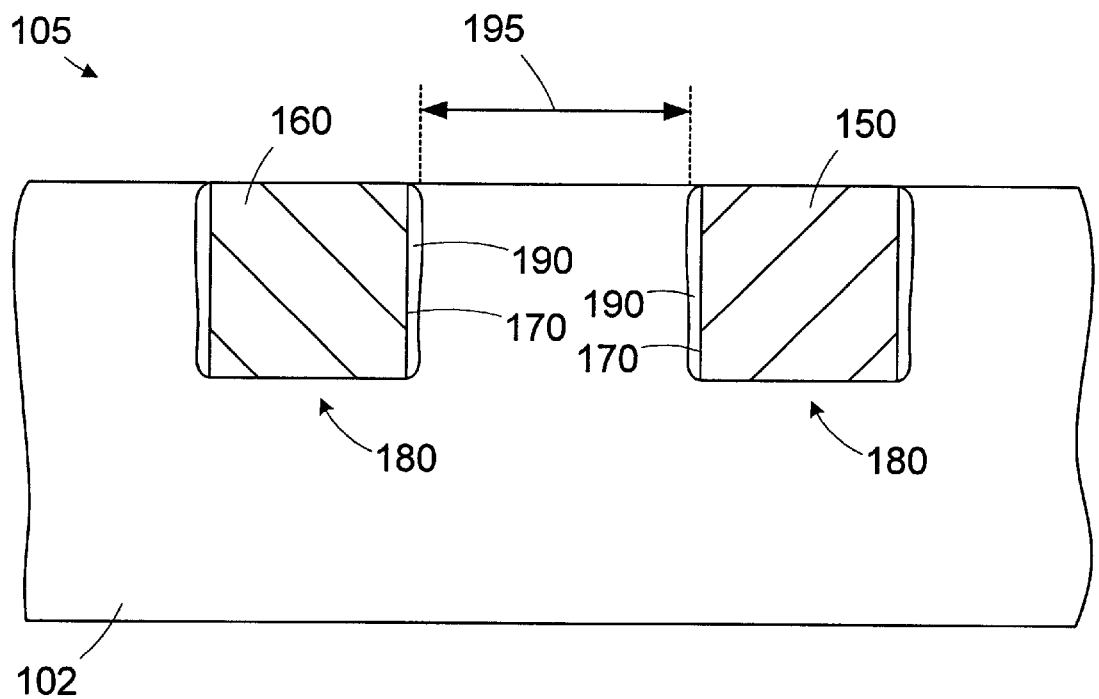
FIGS. 3A and 3B are partial cross section views of first and second test structures in the test circuit of FIG. 2, respectively.
Figure 3B:
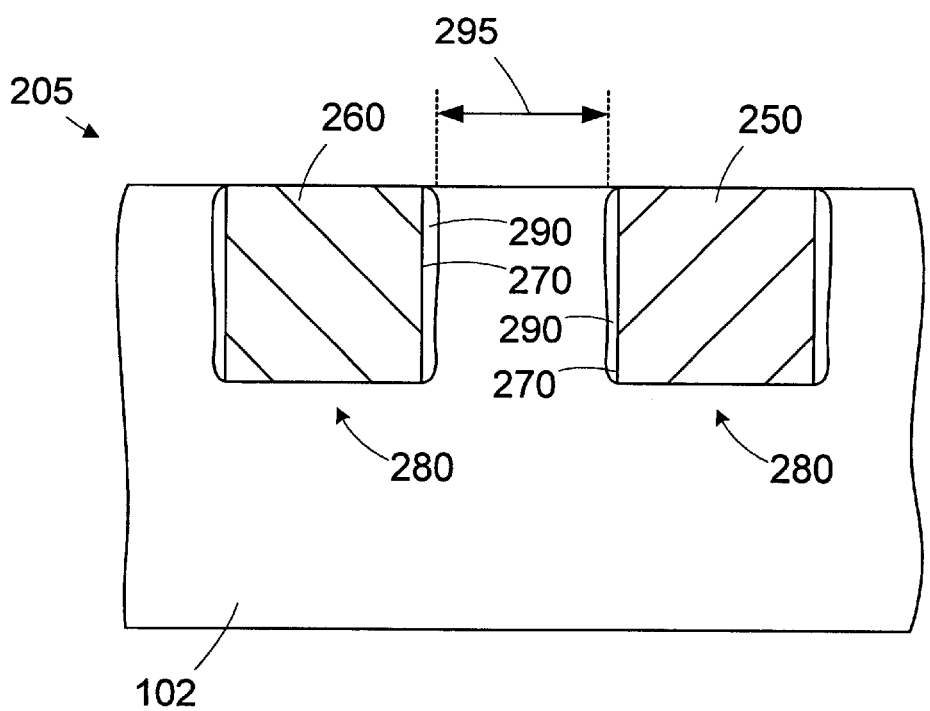

The geometry difference is illustrated in FIGS. 3A and 3B, which are partial cross section views of the first and second test structures 105, 205, respectively. The sidewalls 170 of the trenches 180 in the first test structure 105 have damaged areas 190. Likewise, the sidewalls 270 of the trenches 280 in the second test structure 205 have damaged areas 290. Due to the geometry differences described above, the damaged areas 190 are more widely separated (as denoted by the line 195) than the damaged areas 290 (as denoted by the line 295).

Standard tests are performed on the first structure 105 to determine its electrical characteristics, such as leakage current or capacitance. Similarly, tests are performed on the second structure 205 to determine its electrical characteristics. From the test measurements of capacitance, the effective dielectric constant of the insulative layer 102 is determined. The procedures for determining the electrical characteristics and the subsequent calculations are well known to those of ordinary skill in the art, and thus, are not discussed in greater detail herein.

Because the spacing between the fingers 250, 260 of the second test structure 205 is less than the spacing between the fingers 150, 160 of the first test structure 105, the ratio of damaged insulative layer to undamaged insulative layer (line 290) in the second test structure 205 is higher than in the first test structure 105. Hence, the effective dielectric constant of the insulative layer 105 is higher (i.e., less desirable) proximate the second test structure 205.

The magnitude of the dielectric constant difference depends on the amount of damage and the closeness of the fingers 150, 160, 250, 260. More than two test structures may be employed to provide a finer degree of spacing difference. For two test structures with relatively widely spaced combs, the change in the dielectric constant may be slight. As the combs are disposed more closely together, the change becomes more noticeable. The same effect is present for leakage tests on the plurality of test structures. By comparing the electrical properties across the plurality of test structures, the severity of the sidewall damage may be characterized.

Consider the case where damage to the insulative layer 105 is not localized on the sidewalls 170, 270, but rather distributed relatively evenly across the insulative layer 105. The ratio of the damaged dielectric material to the undamaged dielectric material does not substantially change as the spacing between the combs decrease, hence, the electrical properties will not change in the same manner as with the localized damage.

The first case where the damage is entirely localized and the second case where the damage is entirely distributed represent the extreme cases on a continuum of damage. More likely, the damage to an actual wafer will include some sidewall damage and some distributed damage. Comparison of the electrical properties across the plurality of test structures 105, 205 allows the relative contributions to be determined, at least qualitatively. Such damage characterization may be used to troubleshoot the fabrication process to identify suspect process equipment or recipes. The characterization may be performed by plotting the electrical characteristic vs. finger spacing and comparing the resulting curve to a predetermined empirical or theoretical model. Such a modeling technique may yield a quantitative damage assessment.

Figure 4:
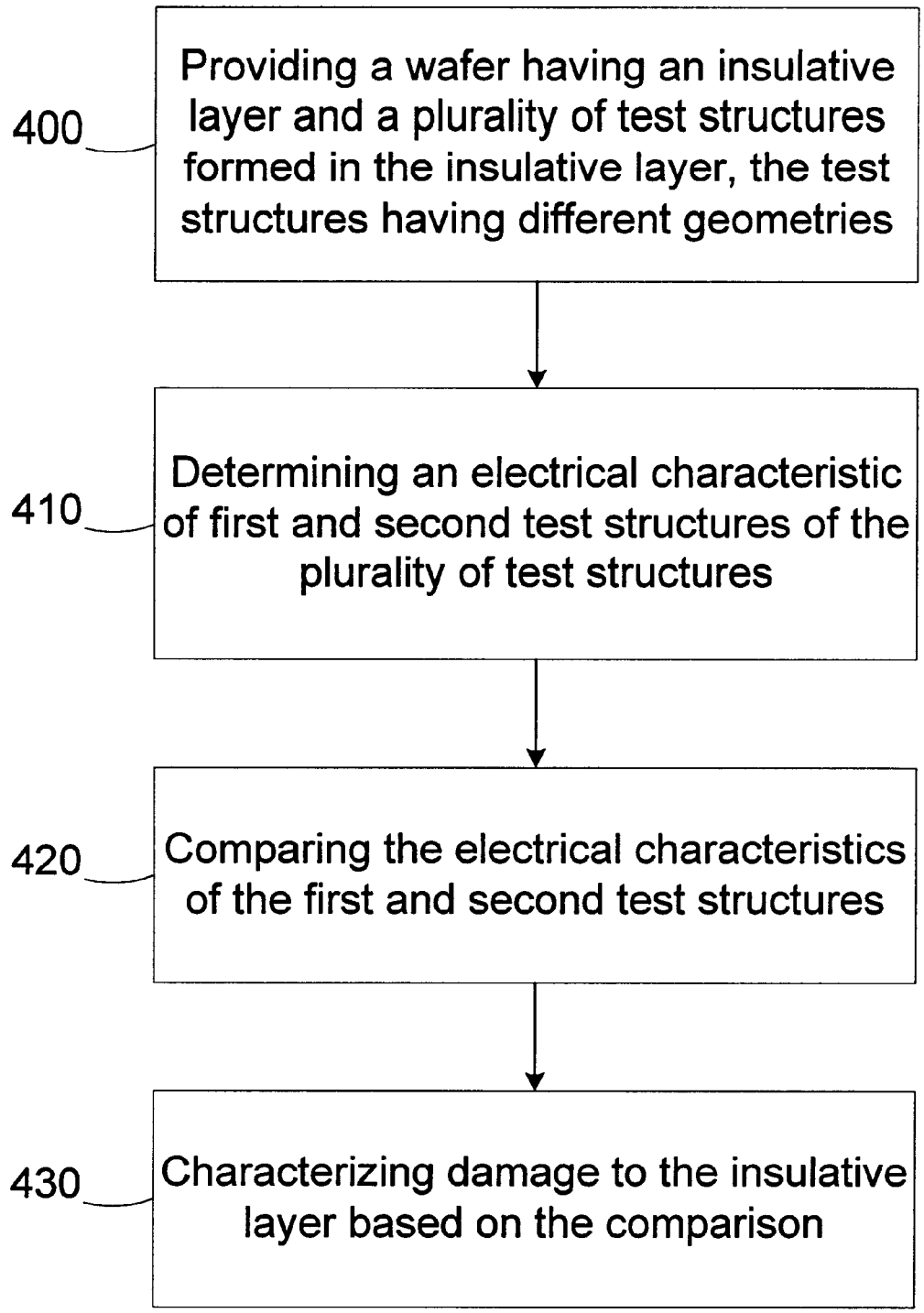
FIG. 4 is a simplified flow diagram of a method for characterizing damage in a semiconductor device in accordance with the present invention.

Turning now to FIG. 4, a simplified flow diagram of a method for characterizing damage in a semiconductor device in accordance with the present invention is provided. The method includes providing a wafer having an insulative layer and a plurality of test structures formed in the insulative layer, as shown in block 400. The test structures have different geometries. In block 410, electrical characteristics (e.g., leakage current, capacitance, dielectric constant) of first and second test structures of the plurality of test structures are determined. The electrical characteristics of the first and second test structures are compared in block 420, and damage to the insulative layer is characterized based on the comparison in block 430. The damage characterization might include determining a degree of sidewall damage, a degree of distributed damage, or both.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for characterizing damage in a semiconductor device, comprising:
   providing a wafer having an insulative layer and a plurality of test structures formed in the insulative layer, the test structures including sidewalls and having different geometries;
   determining an electrical characteristic of first and second test structures of the plurality of test structures;
   comparing the electrical characteristics of the first and second test structures; and
   characterizing damage to the insulative layer based on the comparison to distinguish between damage to the sidewalls and distributed damage to the insulative layer.

2. The method of claim 1, wherein determining the electrical characteristic includes determining at least one of a leakage current and a capacitance of the first and second test structures.

3. The method of claim 1, wherein determining the electrical characteristic includes measuring a capacitance of the first and second test structures, and the method further comprises determining the dielectric constant of the insulative layer proximate the first and second test structures based on the measured capacitances.

4. The method of claim 3 wherein providing the wafer includes providing a wafer having a plurality of comb test structures formed in the insulative layer, each comb test structure further including a serpentine line disposed between the first and second combs of each test structure.

5. The method of claim 1, wherein providing the wafer includes providing a wafer having a plurality of comb test structures formed in the insulative layer, each comb test structure including a first comb having a first plurality of fingers and a second comb having a second plurality of fingers, the first and second pluralities of fingers being interleaved to define a finger spacing between the first and second pluralities of fingers, the finger spacing in a first one of the comb test structures between being different than the finger spacing in a second one of the comb test structures.

6. The method of claim 5, wherein providing the wafer includes providing a wafer having a plurality of comb test structures formed in the insulative layer, the finger spacing in the first one of the test structures being between about 0.18 and 1 micron.

7. The method of claim 5, wherein providing the wafer includes providing a wafer having a plurality of comb test structures formed in the insulative layer, the fingers of the first and second pluralities of fingers having a width of between about 0.2 and 0.5 microns.

8. A method for characterizing damage in a semiconductor device, comprising:
   providing a wafer having an insulative layer and a plurality of comb test structures formed in the insulative layer, each comb test structure including a first comb having a first plurality of fingers and a second comb having a second plurality of fingers, the first and second pluralities of fingers being interleaved to define a finger spacing between the first and second pluralities of fingers, the finger spacing in a first one of the comb test structures between being different than the finger spacing in a second one of the comb test structures;
   determining an electrical characteristic of first and second test structures of the plurality of test structures;
   comparing the electrical characteristics of the first and second test structures; and
   characterizing damage to the insulative layer based on the comparison.

9. The method of claim 8, wherein providing the wafer includes providing a wafer having a plurality of comb test structures formed in the insulative layer, the finger spacing in the first one of the test structures being between about 0.18 and 1 micron.

10. The method of claim 8, wherein providing the wafer includes providing a wafer having a plurality of comb test structures formed in the insulative layer, the fingers of the first and second pluralities of fingers having a width of between about 0.2 and 0.5 microns.

* * * * *